United States Patent
Kishimura et al.

(10) Patent No.: US 6,673,523 B2
(45) Date of Patent: *Jan. 6, 2004

(54) PATTERN FORMATION METHOD

(75) Inventors: Shinji Kishimura, Hyogo (JP); Akiko Katsuyama, Kyoto (JP); Masaru Sasago, Osaka (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 355 days.

(21) Appl. No.: 09/520,805

(22) Filed: Mar. 8, 2000

(65) Prior Publication Data

US 2001/0049075 A1 Dec. 6, 2001

(30) Foreign Application Priority Data

Mar. 9, 1999  (JP) .......................................... 11-061184

(51) Int. Cl.[7] ................................................. G03F 7/26
(52) U.S. Cl. ........................ 430/322; 430/326; 430/907; 430/945
(58) Field of Search ................................ 430/322, 326, 430/945, 907

(56) References Cited

U.S. PATENT DOCUMENTS

| 4,822,721 A | * | 4/1989 | Tsutsumi et al. ............. 430/325 |
| 5,157,091 A | * | 10/1992 | Masataka et al. ............. 526/245 |
| 5,326,675 A | * | 7/1994 | Niki et al. .................... 430/326 |
| 5,554,489 A | * | 9/1996 | Ishibashi et al. ............. 430/326 |
| 5,863,699 A | | 1/1999 | Asakawa et al. ......... 430/270.1 |
| 6,168,909 B1 | * | 1/2001 | Katsuyama ................. 430/326 |
| 6,245,485 B1 | * | 6/2001 | Aoai et al. ................. 430/288.1 |
| 6,291,130 B1 | * | 9/2001 | Kodama et al. .......... 430/270.1 |
| 6,303,268 B1 | * | 10/2001 | Namba et al. ............ 430/270.1 |
| 6,423,467 B1 | * | 7/2002 | Kawauchi et al. ....... 430/270.1 |
| 2001/0010890 A1 | * | 8/2001 | Hatakeyama et al. .... 430/270.1 |
| 2002/0061464 A1 | * | 5/2002 | Aoai et al. ................. 430/270.1 |

FOREIGN PATENT DOCUMENTS

| DE | 41 33 770 A1 | 4/1992 |
| DE | 196 42 053 A1 | 4/1997 |
| EP | 0 824 223 A1 | 2/1998 |
| JP | 60-254041 | 12/1985 |

(List continued on next page.)

OTHER PUBLICATIONS

Database Article, Inst. of Elec. Engrs., Stevengage, GB, Kunz RR et al. "Outlook for 157–nm resist design " Accession No. 6372560 XP002141103, J. of Photopolymer Science & Tech. 1999 Tech Assoc Photopolyers, Japan, vol. 12, No. 4, pp. 561–569.

Database Article, Section Ch, Week 198423 Derwetn Pubs. London GB; AN 1984–145828 XP002141104, Anonymous: Lithography at 157nm–using vacuum–UV fluorine laser excited by electric discharge in helium, fluorine and opt. neon Int. Tech. Discl., No. 01, May 25, 1984.

Primary Examiner—Mark F. Huff
Assistant Examiner—Nicole Barreca
(74) Attorney, Agent, or Firm—Nixon Peabody LLP; Donald R. Studebaker (57) ABSTRACT

A resist film is formed by applying, on a semiconductor substrate, a resist material including at least one atom or group selected from the group consisting of a halogen atom, a cyano group, a nitro group, an alkoxy group, an amino group, an alkyl group, a trifluoromethyl group and a mercapto group. The resist film is irradiated with exposing light of a wavelength of a 1 nm through 180 nm band for pattern exposure, and the resist film is developed after the pattern exposure, so as to form a resist pattern.

15 Claims, 7 Drawing Sheets

FOREIGN PATENT DOCUMENTS

| | | | |
|---|---|---|---|
| JP | 01-215811 | * | 8/1989 |
| JP | 01-215812 | * | 8/1989 |
| JP | 03223861 | | 10/1991 |
| JP | 10186665 | | 7/1998 |
| JP | 11231536 | | 8/1999 |
| JP | 11231537 | | 8/1999 |
| JP | 2001-233917 | * | 8/2001 |
| JP | 2002-169287 | * | 6/2002 |
| WO | WO 00/17712 | | 3/2000 |

* cited by examiner

PATTERN FORMATION METHOD

BACKGROUND OF THE INVENTION

The present invention relates to a pattern formation method, and more particularly, it relates to a pattern formation method of forming a resist pattern used for forming a semiconductor device or a semiconductor integrated circuit on a semiconductor substrate by using exposing light of a wavelength of a 1 nm through 180 nm band.

As exposing light used in forming a resist pattern through pattern exposure of a resist film formed on a semiconductor substrate, KrF excimer laser has been put to practical use. Also, a device including a semiconductor device or a semiconductor integrated circuit formed by using a resist pattern obtained by the pattern exposure using the KrF excimer laser is almost commercially available.

In this case, a resist material including a phenol resin is mainly used as a resist material to be pattern-exposed with the KrF excimer laser.

For further refinement of a semiconductor device or a semiconductor integrated circuit, ArF excimer laser with a shorter wavelength than the KrF excimer laser is used as the exposing light. A resist material including an acrylic acid type resin is mainly under examination as a resist material used in the pattern exposure with the ArF excimer laser.

In order to realize further refinement of a semiconductor device or a semiconductor integrated circuit, however, it is necessary to use, as the exposing light, a laser beam with a wavelength shorter than that of the ArF excimer laser, such as a $Xe_2$ laser beam (with a wavelength of a 172 nm band), a $F_2$ laser beam (with a wavelength of a 157 nm band), a $Kr_2$ laser beam (with a wavelength of a 146 nm band), an ArKr laser beam (with a wavelength of a 134 nm band), an $Ar_2$ laser beam (with a wavelength of a 126 nm band) or a soft X-ray beam (with a wavelength of a 13, 11 or 5 nm band).

Therefore, the present inventors have formed a resist pattern from a resist film of a known resist material through pattern exposure using a $F_2$ laser beam. Now, a method of forming a resist pattern from a known resist material will be described with reference to FIGS. 6(a) through 6(d).

First, a resist material having the following composition is prepared:

| | |
|---|---|
| Base polymer: | |
| poly((2-methyl-2-adamantylmethacrylate) (30 mol %) - (t-butylmethacrylate) (30 mol %) - (methylmethacrylate) (30 mol %) - (methacrylic acid) (10 mol %) | 2 g |
| Acid generator: | |
| triphenylsulfonium triflate | 0.4 g |
| Solvent: | |
| diglyme | 20 g |

Figure 6A:
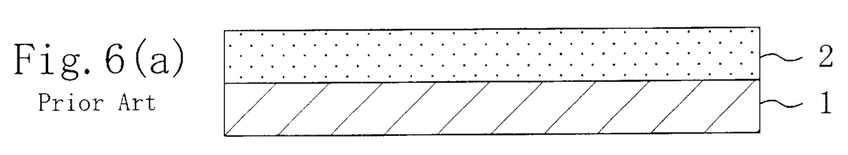
FIGS. 6(a) through 6(d) are sectional views for showing procedures in a pattern formation method as a premise of the invention.

Then, as is shown in FIG. 6(a), the resist material having the aforementioned composition is applied by spin coating on a semiconductor substrate 1, thereby forming a resist film 2 with a thickness of 0.5 μm.

Figure 6B:
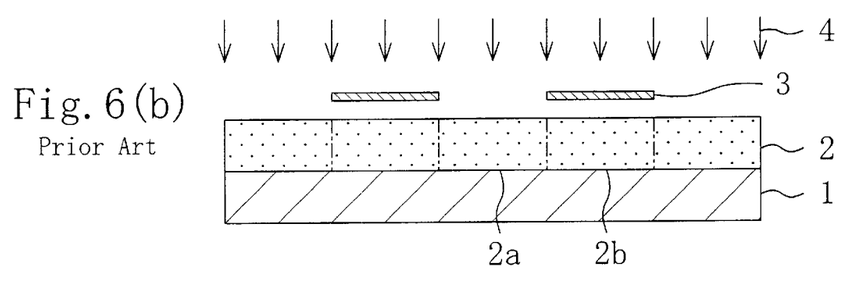

Next, as is shown in FIG. 6(b), the resist film 2 is irradiated with a $F_2$ laser beam 4 through a mask 3 for pattern exposure. In this manner, an acid is generated from the acid generator in an exposed portion 2a of the resist film 2 while no acid is generated in an unexposed portion 2b of the resist film 2.

Figure 6C:
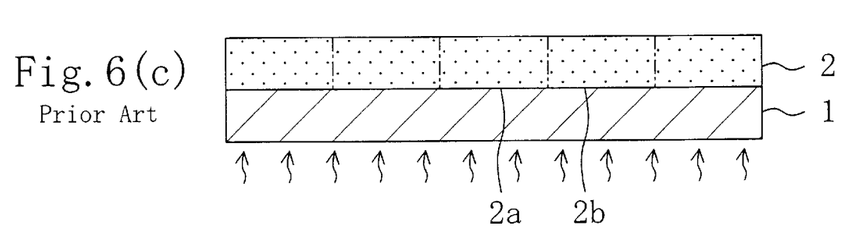

Then, as is shown in FIG. 6(c), the semiconductor substrate 1 is heated with a hot plate, for example, at 100° C. for 60 seconds.

Thereafter, the resist film 2 is developed with an alkaline developer, such as a 2.38 wt % tetramethylammonium hydroxide developer. Thus, the resist pattern is formed.

Figure 6D:
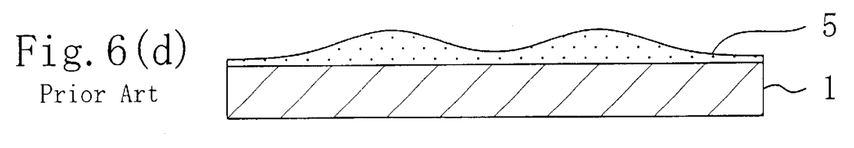

The resultant resist pattern 5 has, however, a defective pattern shape as is shown in FIG. 6(d).

The resist pattern 5 similarly has a defective pattern shape not only when the $F_2$ laser beam is used as the exposing light but also when light of a wavelength of a 1 nm through 180 nm band is used.

SUMMARY OF THE INVENTION

In consideration of the aforementioned conventional problem, an object of the invention is forming a resist pattern in a good pattern shape through pattern exposure using light of a wavelength of a 1 nm through 180 nm band as exposing light.

The present inventors have concluded that the resist pattern has a defective pattern shape because the resist film has a high absorbing property against light of a wavelength of a 1 nm through 180 nm band, and examined various means for decreasing the absorbing property against light of a wavelength of a 1 nm through 180 nm band. As a result, it has been found that the absorbing property of the resist film against light of a wavelength of a 1 nm through 180 nm band can be decreased when the resist material includes a halogen atom, a cyano group, a nitro group, an alkoxy group, an amino group, an alkyl group, a trifluoromethyl group or a mercapto group.

Then, the inventors have examined the reason why the absorbing property against light of a wavelength of a 1 nm through 180 nm band can be decreased when the resist material includes a halogen atom, a cyano group, a nitro group, an alkoxy group, an amino group, an alkyl group, a trifluoromethyl group or a mercapto group. As a result, it has been found that such an atom or a group has a property to shift the absorption wavelength band against the exposing light inherent in the resist material or to decrease the absorbing property of the resist material against light of a short wavelength band.

Now, referring to FIG. 1, an example to verify that the peak of a light absorption wavelength of a resist material against exposing light is shifted toward a longer wavelength when a base polymer of the resist material includes an amino group will be described.

Figure 1:
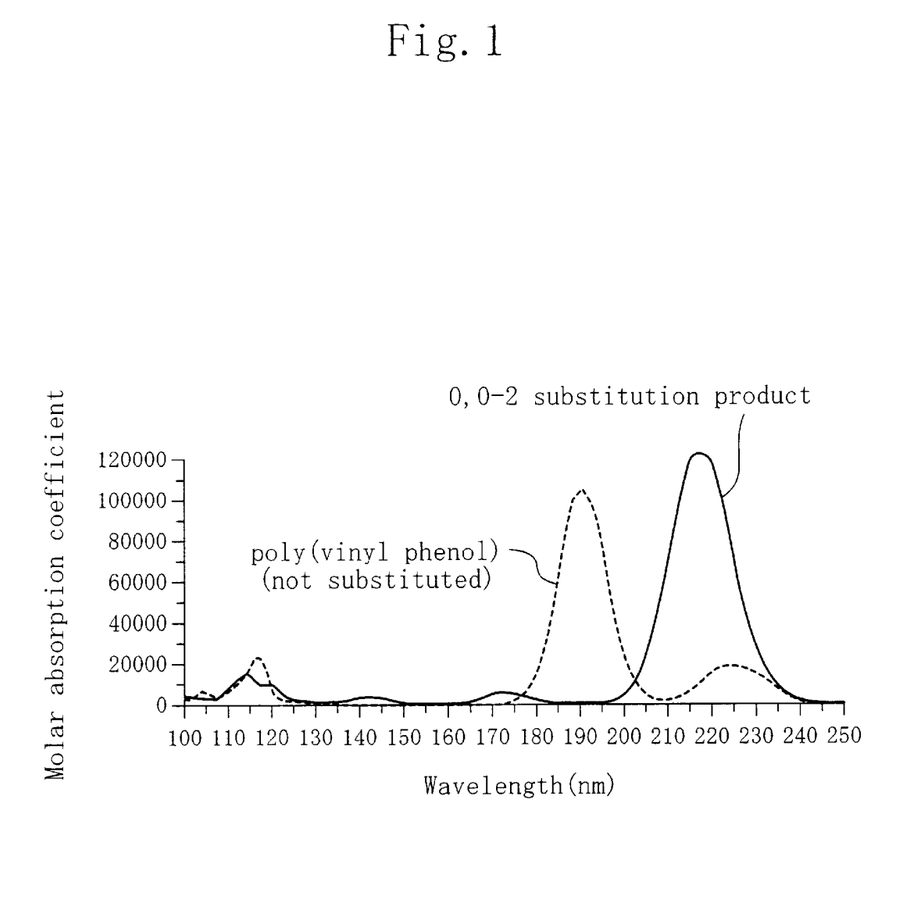
FIG. 1 is a diagram for illustrating the principle of the invention for explaining that a light absorption wavelength band is shifted by substituting an amino group for an aromatic ring of poly(vinyl phenol)

FIG. 1 is a graph for explaining that the absorption zone of the exposing light is shifted by substituting an amino group for an aromatic ring of poly(vinyl phenol). In the graph of FIG. 1, a broken line indicates the absorption wavelength of poly(vinyl phenol) in which an amino group is not substituted for the aromatic ring; and a solid line indicates the absorption wavelength of an o,o-2 substitution product obtained by substituting an amino group for the aromatic ring of poly(vinyl phenol). As is understood from FIG. 1, the peak of the absorption wavelength, which is a 190 nm band when an amino group is not substituted, is shifted toward a longer wavelength by approximately 30 nm when an amino group is substituted.

When the peak of the absorption wavelength zone of the resist film is a 190 nm band, the resist film has poor transmittance against a $F_2$ laser beam with a wavelength of a 157 nm band. However, when the peak of the absorption wavelength zone is shifted from a 190 nm band toward a longer wavelength by approximately 30 nm, the transmittance against the $F_2$ laser beam is increased.

Also Japanese Laid-Open Patent Publication No. 60-254041 discloses a resist material including fluorine, that is, one of halogen atoms, in its base polymer. This resist material includes, in the polymer, α-trifluoromethyl acrylic acid and an ester of alcohol having an electron attractive group as one repeating unit. The publication describes that the sensitivity of the resist material against an electron beam can be thus improved.

However, while an electron beam is used as exposing light in the description of Japanese Laid-Open Patent Publication No. 60-254041, the exposing light is light of a wavelength of a 1 nm through 180 nm band in this invention, and thus, the exposing light is completely different in the wavelength band. Furthermore, while the base polymer includes a halogen atom for the purpose of improving the sensitivity against an electron beam in the description of Japanese Laid-Open Patent Publication No. 60-254041, the polymer includes a halogen atom for the purpose of improving the transmittance against exposing light of a wavelength of a 1 nm through 180 nm band in this invention. Thus, these techniques are completely different in the technical idea.

Specifically, the pattern formation method of this invention comprises a resist film forming step of forming a resist film by applying, on a substrate, a resist material including at least one atom or group selected from the group consisting of a halogen atom, a cyano group, a nitro group, an alkoxy group, an amino group, an alkyl group, a trifluoromethyl group and a mercapto group; and a pattern forming step of forming a resist pattern by irradiating the resist film with exposing light of a wavelength of a 1 nm through 180 nm band for pattern exposure and developing the resist film after the pattern exposure.

In the pattern formation method of this invention, since the resist material includes a halogen atom, a cyano group, a nitro group, an alkoxy group, an amino group, an alkyl group, a trifluoromethyl group or a mercapto group, the absorption wavelength of the resist film against the exposing light is shifted toward a longer wavelength, or the absorbing property of the resist film against the exposing light of a short wavelength is decreased. Accordingly, the absorbing property against light of a wavelength of a 1 nm through 180 nm band can be decreased, and hence, the transmittance against light of a wavelength of a 1 nm through 180 nm band can be increased. As a result, a resist pattern can be formed in a good pattern shape through the pattern exposure using light of a 1 nm through 180 nm band as the exposing light.

In the pattern formation method, the atom or group is preferably bonded to a main chain, a side chain, a hetero ring or carbon constituting a double bond of a base polymer of the resist material.

In the pattern formation method, the atom or group is preferably a halogen atom bonded to an ester portion of an acrylic resin serving as a base polymer of the resist material.

In the pattern formation method, the resist material is preferably a chemically amplified resist.

When the resist material is a chemically amplified resist, the atom or group is preferably included in a protecting group of a base polymer, a crosslinking agent or an agent for inhibiting dissolution of the base polymer of the chemically amplified resist.

In the pattern formation method, a base polymer of the resist material preferably includes poly(vinyl phenol), poly(vinyl alcohol), an acrylic acid, a novolak resin or a derivative thereof in which a fluorine atom is substituted for a hydrogen atom.

The pattern formation method of this invention preferably further comprises, between the resist film forming step and the pattern forming step, a step of forming, on the resist film, a water-soluble polymer film from a water-soluble polymer including a halogen atom, a cyano group, a nitro group, an alkoxy group, an amino group, an alkyl group, a trifluoromethyl group or a mercapto group.

In this case, the water-soluble polymer is preferably polyacrylic acid, poly(vinyl alcohol), poly(vinyl pyrrolidone) or polystyrenesulfonic acid.

Alternatively, the pattern formation method of this invention preferably further comprises, between the resist film forming step and the pattern forming step, a step of forming, on the resist film, a water-soluble polymer film from a compound including a halogen atom, a cyano group, a nitro group, an alkoxy group, an amino group, an alkyl group, a trifluoromethyl group or a mercapto group, and a water-soluble polymer.

In this case, the compound is preferably trifluoroacetic acid, trifluoromethylsulfonic acid-or a surfactant including fluorine.

Also in this case, the water-soluble polymer is preferably polyacrylic acid, poly(vinyl alcohol), poly(vinyl pyrrolidone) or polystyrenesulfonic acid.

In the pattern formation method, the exposing light is preferably a $F_2$ laser beam or an $Ar_2$ laser beam.

DETAILED DESCRIPTION OF THE INVENTION

Embodiment 1

In a base polymer of a resist material used in a pattern formation method of Embodiment 1, fluorine atoms are substituted for part of hydrogen atoms bonded to a benzene ring of poly(vinyl phenol). The specific composition of the resist material is as follows:

| Base polymer: | |
|---|---|
| poly(o,o-difluoro-p-hydroxystyrene-co-p-(t-butoxy)o,o-difluorostyrene | 1 g |
| Acid generator: | |
| bis(dicyclohexylsulfonyl)diazomethane | 0.01 g |
| Solvent: | |
| propylene glycol monoethyl ether acetate | 4 g |

Figure 2A:
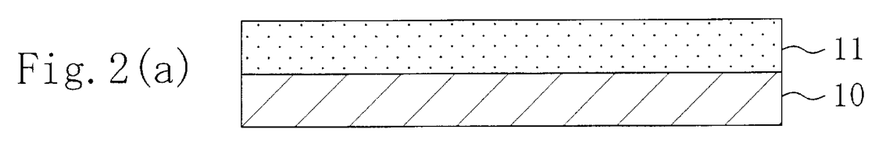
FIGS. 2(a) through 2(d) are sectional views for showing procedures in a pattern formation method according any of Embodiments 1 through 9 of the invention.

First, as is shown in FIG. 2(a), the resist material having the aforementioned composition is applied by spin coating on a semiconductor substrate 10, thereby forming a resist film 11 with a thickness of 0.3 μm.

Figure 2B:
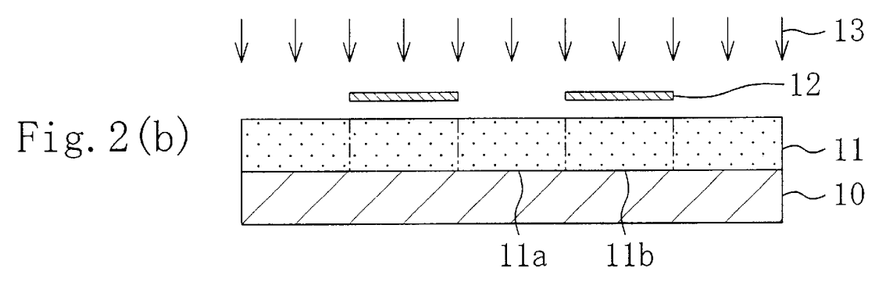

Next, as is shown in FIG. 2(b), the resist film 11 is irradiated with a $F_2$ laser beam 13 with a wavelength of a 157 nm band through a mask 12 for pattern exposure. In this manner, an acid is generated from the acid generator in an exposed portion 11a of the resist film 11 while no acid is generated in an unexposed portion 11b of the resist film 11.

Figure 2C:
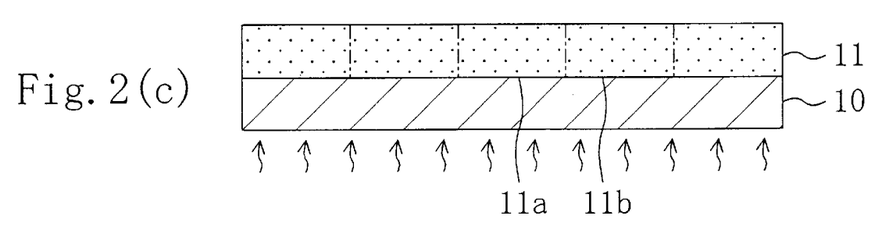

Then, as is shown in FIG. 2(c), the semiconductor substrate 10 together with the resist film 11 are heated. Although the base polymer is alkali-refractory, it decomposes when heated in the presence of an acid, and hence, the exposed portion 11a of the resist film 11 becomes soluble in an alkaline aqueous solution.

Figure 2D:
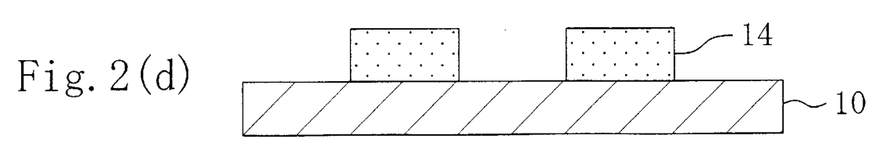

Thereafter, the resist film 11 is developed with an alkaline developer, and the exposed portion 11a of the resist film 11 is dissolved in the developer. As a result, the unexposed portion 11b of the resist film 11 is formed into a resist pattern 14 as is shown in FIG. 2(d).

In the base polymer of Embodiment 1, fluorine atoms are substituted for part of hydrogen atoms bonded to the benzene ring, and hence, the peak of the light absorption wavelength determined by the benzene ring is shifted toward a longer wavelength, resulting in decreasing the absorbing property against light of a wavelength of a 1 nm through 180 nm band. Therefore, the transmittance against the exposing light of a wavelength of a 1 nm through 180 nm band is increased, and hence, the exposing light can sufficiently reach the bottom of the resist film 11. As a result, the resist pattern can be formed in a good sectional shape with a line width of 0.09 μm.

Modification 1 of Embodiment 1

Modification 1 of Embodiment 1 is different from Embodiment 1 in the resist material alone, and hence, the resist material alone will be herein described. Specifically, the resist material of Modification 1 includes a base polymer in which chlorine atoms are substituted for part of hydrogen atoms bonded to the benzene ring of poly(vinyl phenol).

| Base polymer: | |
|---|---|
| poly(o,o-dichloro-p-hydroxystyrene-co-p-(t-butoxy)o,o-dichlorostyrene | 1 g |
| Acid generator: | |
| bis(dicyclohexylsulfonyl)diazomethane | 0.01 g |
| Solvent: | |
| propylene glycol monoethyl ether acetate | 4 g |

Modification 2 of Embodiment 1

Modification 2 of Embodiment 1 is different from Embodiment 1 in the resist material alone, and hence, the resist material alone will be herein described. Specifically, the resist material includes a base polymer in which chlorine atoms are substituted for part of hydrogen atoms bonded to the benzene ring of poly(vinyl phenol).

| Base polymer: | |
|---|---|
| poly(m,m-dichloro-p-hydroxystyrene-co-p-(t-butoxy)m,m-dichlorostyrene | 1 g |
| Acid generator: | |
| bis(dicyclohexylsulfonyl)diazomethane | 0.01 g |
| Solvent: | |
| propylene glycol monoethyl ether acetate | 4 g |

Embodiment 2

In a base polymer of a resist material used in a pattern formation method of Embodiment 2, fluorine atoms are substituted for part of hydrogen atoms bonded to a polymer main chain of poly(vinyl phenol). The specific composition of the resist material is as follows:

| Base polymer: | |
|---|---|
| poly(p-(2,2-difluorovinyl)phenol-co-p-(1-ethoxyethoxy)-2,2-difluorostyrene) | 1 g |
| Acid generator: | |
| bis(dicyclohexylsulfonyl)diazomethane | 0.01 g |
| Solvent: | |
| ethylethoxypropyonate | 4 g |

First, as is shown in FIG. 2(a), the resist material having the aforementioned composition is applied by spin coating on a semiconductor substrate 10, thereby forming a resist film 11. Then, as is shown in FIG. 2(b), the resist film 11 is irradiated with a $F_2$ laser beam 13 with a wavelength of a 157 nm band through a mask 12 for pattern exposure. In this manner, an acid is generated from the acid generator in an exposed portion 11a of the resist film 11 while no acid is generated in an unexposed portion 11b of the resist film 11.

Next, as is shown in FIG. 2(c), the semiconductor substrate 10 is heated. Although the base polymer is alkali-refractory, it decomposes when heated in the presence of an acid, and hence, the exposed portion 11a of the resist film 11 becomes soluble in an alkaline aqueous solution.

Thereafter, the resist film 11 is developed with an alkaline developer. Since the exposed portion 11a of the resist film 11 is dissolved in the developer, the unexposed portion 11b of the resist film 11 is formed into a resist pattern 14 as is shown in FIG. 2(d).

In the base polymer of Embodiment 2, fluorine atoms are substituted for part of hydrogen atoms bonded to the polymer main chain, and hence, the absorbing property against light of a short wavelength is decreased. Therefore, the absorbing property against light of a wavelength of a 1 nm through 180 nm band is decreased. Accordingly, the transmittance against the exposing light of a wavelength of a 1 nm through 180 nm band is increased, and hence, the exposing light can sufficiently reach the bottom of the resist film 11. As a result, the resist pattern can be formed in a good sectional shape with a line width of 0.1 μm.

Modification of Embodiment 2

Modification of Embodiment 2 is different from Embodiment 2 in the resist material alone, and hence, the resist material alone will be herein described. Specifically, the resist material includes a base polymer in which trifluoromethyl groups are substituted for part of hydrogen atoms bonded to the polymer main chain of poly(vinyl phenol).

| Base polymer: | |
|---|---|
| poly(p-(α-trifluoromethylvinyl)phenol-co-p-(1-ethoxyethoxy)-α-trifluoromethylstyrene) | 1 g |
| Acid generator: | |
| bis(dicyclohexylsulfonyl)diazomethane | 0.01 g |
| Solvent: | |
| ethylethoxypropyonate | 4 g |

Embodiment 3

In a base polymer of a resist material used in a pattern formation method of Embodiment 3, fluorine atoms are substituted for part of hydrogen atoms bonded to a polymer main chain of poly(vinyl phenol) and part of hydrogen atoms bonded to a benzene ring. The specific composition of the resist material is as follows:

| Base polymer: | |
|---|---|
| poly(p-hydroxyheptafluorostyrene-co-p-(t-butoxy)-heptafluorostyrene) | 1 g |
| Acid generator: | |
| triphenylsulfonium triflate | 0.01 g |
| Solvent: | |
| ethylethoxypropyonate | 4 g |

First, as is shown in FIG. 2(a), the resist material having the aforementioned composition is applied by spin coating on a semiconductor substrate 10, thereby forming a resist film 11. Then, as is shown in FIG. 2(b), the resist film 11 is irradiated with a $F_2$ laser beam 13 with a wavelength of a 157 nm band through a mask 12 for pattern exposure. In this manner, an acid is generated from the acid generator in an exposed portion 11a of the resist film 11 while no acid is generated in an unexposed portion 11b of the resist film 11.

Next, as is shown in FIG. 2(c), the semiconductor substrate 10 is heated. Although the base polymer is alkali-refractory, it decomposes when heated in the presence of an acid, and hence, the exposed portion 11a of the resist film 11 becomes soluble in an alkaline aqueous solution.

Thereafter, the resist film 11 is developed with an alkaline developer. Since the exposed portion 11a of the resist film 11 is dissolved in the developer, the unexposed portion 11b of the resist film 11 is formed into a resist pattern 14 as is shown in FIG. 2(d).

In the base polymer of Embodiment 3, fluorine atoms are substituted for part of hydrogen atoms bonded to the polymer main chain and the benzene ring, and hence, the absorbing property against light of a short wavelength is decreased and the peak of the light absorption wavelength determined by the benzene ring is shifted toward a longer wavelength. Therefore, the absorbing property against light of a wavelength of a 1 nm through 180 nm band is decreased. Accordingly, the transmittance against the exposing light of a wavelength of a 1 nm through 180 nm band is increased, and hence, the exposing light can sufficiently reach the bottom of the resist film 11. As a result, the resist pattern can be formed in a good sectional shape with a line width of 0.08 μm.

Modification of Embodiment 3

Modification of Embodiment 3 is different from Embodiment 3 in the resist material alone, and hence, the resist material alone will be herein described. Specifically, the resist material includes a base polymer in which alkyl groups, such as a methyl group, are substituted for part of hydrogen atoms bonded to the polymer main chain of poly(vinyl phenol) and part of hydrogen atoms bonded to the benzene ring.

| Base polymer: | |
|---|---|
| poly(p-hydroxy-α-methyl-o-methylstyrene-co-p-(t-butoxy)-α-methyl-o-methylstyrene) | 1 g |
| Acid generator: | |
| triphenylsulfonium triflate | 0.01 g |
| Solvent: | |
| ethylethoxypropyonate | 4 g |

Embodiment 4

In a base polymer of a resist material used in a pattern formation method of Embodiment 4, fluorine atoms are substituted for part of hydrogen atoms bonded to a polymer main chain of an acrylic resin. The specific composition of the resist material is as follows:

| Base polymer: | |
|---|---|
| poly(α-fluoroacrylic acid-co-α-fluoro tetrahydropyranyl-acrylate-co-α-fluoro norbornylacrylate) | 1 g |
| Acid generator: | |
| triphenylsulfonium triflate | 0.01 g |
| Solvent: | |
| propylene glycol monoethyl ether acetate | 4 g |

First, as is shown in FIG. 2(a), the resist material having the aforementioned composition is applied by spin coating on a semiconductor substrate 10, thereby forming a resist film 11. Then, as is shown in FIG. 2(b), the resist film 11 is irradiated with a $F_2$ laser beam 13 with a wavelength of a 157 nm band through a mask 12 for pattern exposure. In this manner, an acid is generated from the acid generator in an exposed portion 11a of the resist film 11 while no acid is generated in an unexposed portion 11b of the resist film 11.

Next, as is shown in FIG. 2(c), the semiconductor substrate 10 is heated. Although the base polymer is alkali-refractory, it decomposes when heated in the presence of an acid, and hence, the exposed portion 11a of the resist film 11 becomes soluble in an alkaline aqueous solution.

Thereafter, the resist film 11 is developed with an alkaline developer. Since the exposed portion 11a of the resist film 11 is dissolved in the developer, the unexposed portion 11b of the resist film 11 is formed into a resist pattern 14 as is shown in FIG. 2(d).

In the base polymer of Embodiment 4, fluorine atoms are substituted for part of hydrogen atoms bonded to the polymer main chain, and hence, the absorbing property against light of a short wavelength is decreased. Therefore, the absorbing property against light of a wavelength of a 1 nm through 180 nm band is decreased. Accordingly, the transmittance against the exposing light of a wavelength of a 1 nm through 180 nm band is increased, and hence, the exposing light can sufficiently reach the bottom of the resist film 11. As a result, the resist pattern can be formed in a good sectional shape with a line width of 0.1 μm.

Modification of Embodiment 4

Modification of Embodiment 4 is different from Embodiment 4 in the resist material alone, and hence, the resist material alone will be herein described. Specifically, the resist material includes a base polymer in which chlorine atoms are substituted for part of hydrogen atoms bonded to a polymer main chain of the acrylic acid, and a protecting group of a hetero ring of the acrylic resin includes a nitro group.

| Base polymer: | |
|---|---|
| poly(α-fluoroacrylic acid-co-α-chloro-3-nitrotetrahydropyranylacrylate-co-α-chloro norbornyl acrylate) | 1 g |
| Acid generator: | |
| triphenylsulfonium triflate | 0.01 g |
| Solvent: | |
| propylene glycol monoethyl ether acetate | 4 g |

Embodiment 5

In a base polymer of a resist material used in a pattern formation method of Embodiment 5, fluorine atoms are substituted for part of hydrogen atoms bonded to a polymer main chain of poly(vinyl alcohol). The specific composition of the resist material is as follows:

| Base polymer: | |
|---|---|
| poly(1,2-difluoro-1-hydroxyethylene-co-1,2-difluoro-1-t-butoxyethylene) | 1 g |
| Acid generator: | |
| diphenyliodonium triflate | 0.01 g |
| Solvent: | |
| ethylethoxypropyonate | 4 g |

First, as is shown in FIG. 2(a), the resist material having the aforementioned composition is applied by spin coating on a semiconductor substrate 10, thereby forming a resist film 11. Then, as is shown in FIG. 2(b), the resist film 11 is irradiated with a $F_2$ laser beam 13 with a wavelength of a 157 nm band through a mask 12 for pattern exposure. In this manner, an acid is generated from the acid generator in an exposed portion 11a of the resist film 11 while no acid is generated in an unexposed portion 11b of the resist film 11.

Next, as is shown in FIG. 2(c), the semiconductor substrate 10 is heated. Although the base polymer is alkali-refractory, it decomposes when heated in the presence of an acid, and hence, the exposed portion 11a of the resist film 11 becomes soluble in an alkaline aqueous solution.

Thereafter, the resist film 11 is developed with an alkaline developer. Since the exposed portion 11a of the resist film 11 is dissolved in the developer, the unexposed portion 11b of the resist film 11 is formed into a resist pattern 14 as is shown in FIG. 2(d).

In the base polymer of Embodiment 5, fluorine atoms are substituted for part of hydrogen atoms bonded to the polymer main chain, and hence, the absorbing property against light of a short wavelength is decreased. Therefore, the absorbing property against light of a wavelength of a 1 nm through 180 nm band is decreased. Accordingly, the transmittance against the exposing light of a wavelength of a 1 nm through 180 nm band is increased, and hence, the exposing light can sufficiently reach the bottom of the resist film 11. As a result, the resist pattern can be formed in a good sectional shape with a line width of 0.1 μm.

Embodiment 6

In a base polymer of a resist material used in a pattern formation method of Embodiment 6, an alkyl group such as a methyl group is included, and a fluorine atom is substituted for a hydrogen atom bonded to a side chain of the base polymer, in particular, a hydrogen atom in an ester portion of an acrylic resin. The specific composition of the resist material is as follows:

| Base polymer: | |
|---|---|
| poly((2-methyl-2-adamantylmethacrylate) (30 mol %) - (tri(trifluoromethyl)methacrylate (30 mol %) - (methylmethacrylate) (30 mol %) - (methacrylic acid) (10 mol %) | 2 g |
| Acid generator: | |
| triphenylsulfonium triflate | 0.4 g |
| Solvent: | |
| diglyme | 20 g |

First, as is shown in FIG. 2(a), the resist material having the aforementioned composition is applied by spin coating on a semiconductor substrate 10, thereby forming a resist film 11. Then, as is shown in FIG. 2(b), the resist film 11 is irradiated with a $F_2$ laser beam 13 with a wavelength of a 157 nm band through a mask 12 for pattern exposure. In this manner, an acid is generated from the acid generator in an exposed portion 11a of the resist film 11 while no acid is generated in an unexposed portion 11b of the resist film 11.

Next, as is shown in FIG. 2(c), the semiconductor substrate 10 is heated. Although the base polymer is alkali-refractory, it decomposes when heated in the presence of an acid, and hence, the exposed portion 11a of the resist film 11 becomes soluble in an alkaline aqueous solution.

Thereafter, the resist film 11 is developed with an alkaline developer such as a 2.38 wt % tetramethylammonium hydroxide developer. Since the exposed portion 11a of the resist film 11 is dissolved in the developer, the unexposed portion 11b of the resist film 11 is formed into a resist pattern 14 as is shown in FIG. 2(d).

In the base polymer of Embodiment 6, a methyl group is included and a fluorine atom is substituted for a hydrogen atom bonded to the side chain of the base polymer, and hence, the absorbing property against light of a short wavelength is decreased. Therefore, the absorbing property against light of a wavelength of a 1 nm through 180 nm band is decreased. Accordingly, the transmittance against the exposing light of a wavelength of a 1 nm through 180 nm band is increased, and hence, the exposing light can sufficiently reach the bottom of the resist film 11. As a result, the resist pattern can be formed in a good sectional shape with a line width of 0.07 μm.

Modification 1 of Embodiment 6

Modification 1 of Embodiment 6 is different from Embodiment 6 in the resist material alone, and hence, the resist material alone will be herein described. Specifically, the resist material includes a base polymer in which a fluorine atom is substituted for a hydrogen atom bonded to a side chain of the base polymer, in particular, a hydrogen atom in an ester portion of the acrylic resin. The specific composition of the resist material is as follows:

Base polymer:

poly(2,2,2-trifluoroethylmethacrylate) (represented by Chemical Formula 1 below)    2 g
Acid generator:

triphenylsulfonium triflate    0.4 g
Solvent:

diglyme    20 g

Chemical Formula 1:

Modification 2 of Embodiment 6

Modification 2 of Embodiment 6 is different from Embodiment 6 in the resist material alone, and hence, the resist material alone will be herein described. Specifically, the resist material includes a base polymer in which a fluorine atom is substituted for a hydrogen atom bonded to a side chain of the base polymer, in particular, a hydrogen atom in an ester portion of the acrylic resin. The specific composition of the resist material is as follows:

Base polymer:

poly(1,1,1,3,3,3-hexafluoroisopropylmethacrylate) (represented by Chemical Formula 2 below)    2 g
Acid generator:

triphenylsulfonium triflate    0.4 g
Solvent:

diglyme    20 g

Figure 7:
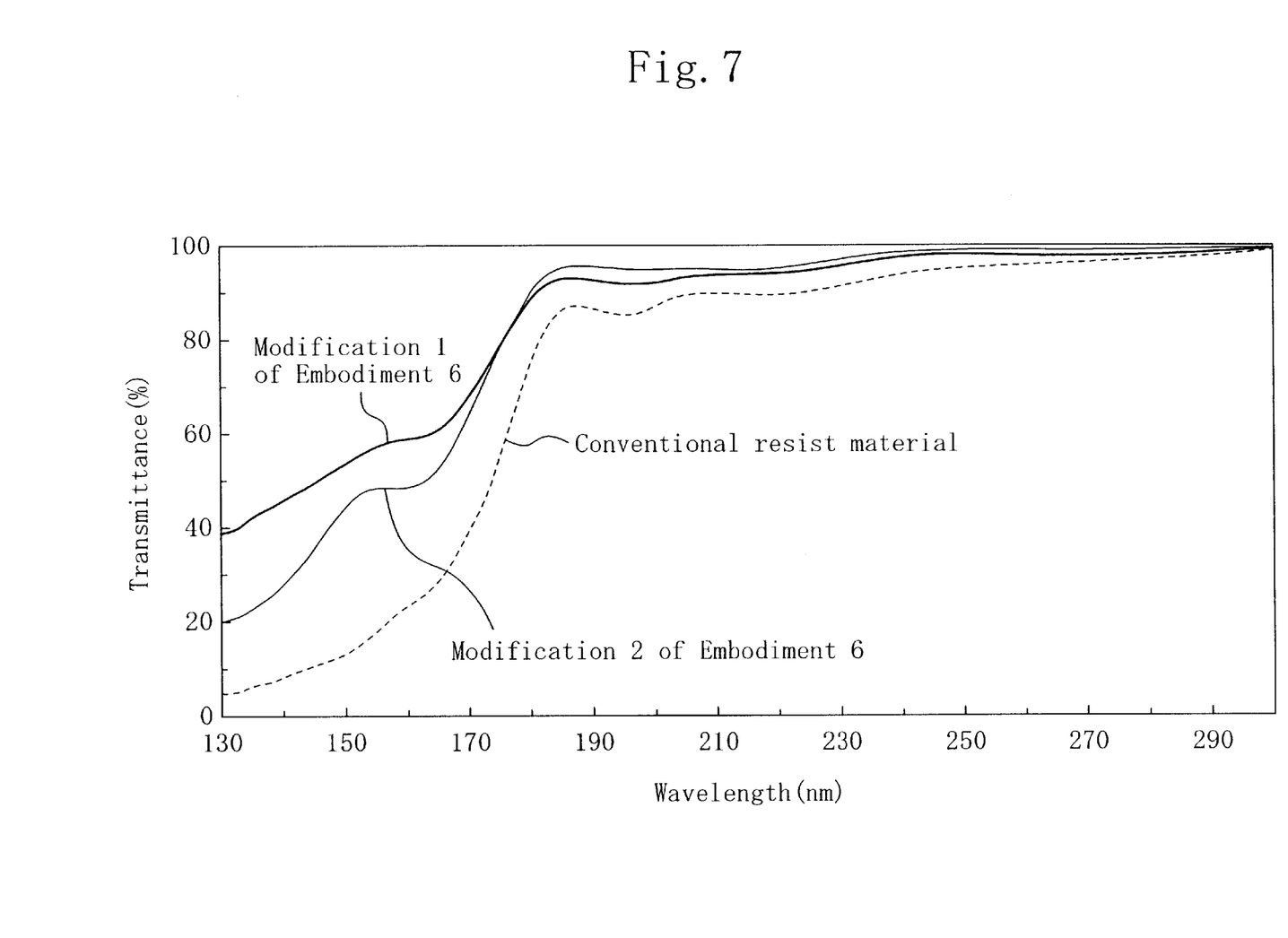
FIG. 7 is a diagram for showing the relationship between the wavelength of exposing light and transmittance of resist films each with a thickness of 0.1 μm respectively formed from resist materials according to Modifications 1 and 2 of Embodiment 6 of the invention and a conventional resist material.

Chemical Formula 2:

FIG. 7 shows the relationship between the wavelength of exposing light and transmittance obtained when resist films each with a thickness of 0.1 μm are respectively formed by using the resist materials of Modifications 1 and 2 of Embodiment 6 and a conventional resist material.

It is understood from FIG. 7 that transmittance of 40% or more is attained against a wavelength of a 157 nm band ($F_2$ laser beam) according to Modifications 1 and 2 of Embodiment 6. In using the conventional resist material, the transmittance against the wavelength of a 157 nm band ($F_2$ laser beam) is approximately 20%.

Embodiment 7

In a base polymer of a resist material used in a pattern formation method of Embodiment 7, an alkyl group such as a methyl group is included, and a fluorine atom is substituted for a hydrogen atom in a protecting group of the base polymer. The specific composition of the resist material is as follows:

Base polymer:

poly((2,2,2-trifluoroethylmethacrylate) - (2-methyl-2-adamantyl-methacrylate) (represented by Formula 3 below)    2 g
Acid generator:

triphenylsulfonium triflate    0.4 g
Solvent:

diglyme    20 g

Chemical Formula 3:

First, as is shown in FIG. 2(a), the resist material having the aforementioned composition is applied by spin coating on a semiconductor substrate 10, thereby forming a resist film 11. Then, as is shown in FIG. 2(b), the resist film 11 is irradiated with a $F_2$ laser beam 13 with a wavelength of a 157 nm band through a mask 12 for pattern exposure. In this manner, an acid is generated from the acid generator in an exposed portion 11a of the resist film 11 while no acid is generated in an unexposed portion 11b of the resist film 11.

Next, as is shown in FIG. 2(c), the semiconductor substrate 10 is heated. Although the base polymer is alkali-refractory, it decomposes when heated in the presence of an acid, and hence, the exposed portion 11a of the resist film 11 becomes soluble in an alkaline aqueous solution.

Thereafter, the resist film 11 is developed with an alkaline developer such as a 2.38 wt % tetramethylammonium hydroxide developer. Since the exposed portion 11a of the resist film 11 is dissolved in the developer, the unexposed portion 11b of the resist film 11 is formed into a resist pattern 14 as is shown in FIG. 2(d).

In the base polymer of Embodiment 7, a methyl group is included, and a fluorine atom is substituted for a hydrogen atom in the protecting group of the base polymer, and hence, the absorbing property against light of a short wavelength is decreased. Therefore, the absorbing property against light of a wavelength of a 1 nm through 180 nm band is decreased. Accordingly, the transmittance against the exposing light of a wavelength of a 1 nm through 180 nm band is increased, and hence, the exposing light can sufficiently reach the bottom of the resist film 11. As a result, the resist pattern can be formed in a good sectional shape with a line width of 0.07 μm.

Examples of the protecting group of the base polymer of Embodiment 7 are a t-butyl group, a 1-ethoxyethyl group and a t-butyloxycarbonyl group substituted by a halogen atom, a cyano group, a nitro group, an alkoxy group, an amino group, an alkyl group, a trifluoromethyl group or a mercapto group.

Embodiment 8

In a base polymer of a resist material used in a pattern formation method of Embodiment 8, fluorine atoms are substituted for part of hydrogen atoms bonded to a benzene ring of poly(vinyl phenol), and an agent for inhibiting dissolution of a base polymer (hereinafter referred to as a dissolution inhibiting agent) in which fluorine atoms are substituted for part of hydrogen atoms bonded to a benzene ring is included in the resist material. The specific composition of the resist material is as follows:

| Base polymer: | |
|---|---|
| poly(o,o-difluoro-p-hydroxystyrene-co-o,o-difluoro-p-trifluoromethoxystyrene) | 1 g |
| Dissolution inhibiting agent: | |
| bis(p-(t-butoxycarbonyloxy)-m,m-difluorophenyl)methane | 0.4 g |
| Acid generator: | |
| triphenylsulfonium triflate | 0.01 g |
| Solvent: | |
| ethylethoxypropyonate | 4 g |

First, as is shown in FIG. 2(a), the resist material having the aforementioned composition is applied by spin coating on a semiconductor substrate 10, thereby forming a resist film 11. Then, as is shown in FIG. 2(b), the resist film 11 is irradiated with a $F_2$ laser beam 13 with a wavelength of a 157 nm band through a mask 12 for pattern exposure. In this manner, an acid is generated from the acid generator in an exposed portion 11a of the resist film 11 while no acid is generated in an unexposed portion 11b of the resist film 11.

Although the base polymer is alkali-soluble, the resist film 11 is alkali-refractory due to the function of the dissolution inhibiting agent. Therefore, when the semiconductor substrate 10 is heated as is shown in FIG. 2(c), the dissolution inhibiting agent is heated in the presence of an acid, and hence, it decomposes. As a result, the exposed portion 11a of the resist film 11 becomes soluble in an alkaline aqueous solution.

Thereafter, the resist film 11 is developed with an alkaline developer. Since the exposed portion 11a of the resist film 11 is dissolved in the developer, the unexposed portion 11b of the resist film 11 is formed into a resist pattern 14 as is shown in FIG. 2(d).

In the base polymer and the dissolution inhibiting agent of Embodiment 8, fluorine atoms are substituted for part of hydrogen atoms bonded to the benzene ring, and hence, the peak of the light absorption wavelength determined by the benzene ring is shifted toward a longer wavelength. Therefore, the absorbing property against light of a wavelength of a 1 nm through 180 nm band is decreased. Accordingly, the transmittance against the exposing light of a wavelength of a 1 nm through 180 nm band is increased, and hence, the exposing light can sufficiently reach the bottom of the resist film 11. As a result, the resist pattern can be formed in a good sectional shape with a line width of 0.1 μm.

Modification of Embodiment 8

Modification of Embodiment 8 is different from Embodiment 8 in the resist material alone, and hence, the resist material alone will be herein described. Specifically, the resist material includes a base polymer in which amino groups are substituted for part of hydrogen atoms bonded to a benzene ring of poly(vinyl phenol), and further includes the dissolution inhibiting agent including a cyano group.

| Base polymer: | |
|---|---|
| poly(o-amino-p-hydroxystyrene-co-o-amino-p-methoxystyrene) | 1 g |
| Dissolution inhibiting agent: | |
| bis(p-(t-butoxy)-m-cyanophenyl)methane | 0.4 g |
| Acid generator: | |
| triphenylsulfonium triflate | 0.01 g |
| Solvent: | |
| ethylethoxypropyonate | 4 g |

Embodiment 9

In a base polymer of a resist material used in a pattern formation method of Embodiment 9, an amino group is bonded to carbon constituting a double bond. The specific composition of the resist material is as follows:

| Base polymer: | |
|---|---|
| poly((1-vinyloxy)3-amino-2-cyclohexene-co-vinyloxyethoxyethane) | 1 g |
| Acid generator: | |
| trimethylsulfonium triflate | 0.01 g |
| Solvent: | |
| propylene glycol monoethyl ether acetate | 4 g |

First, as is shown in FIG. 2(a), the resist material having the aforementioned composition is applied by spin coating on a semiconductor substrate 10, thereby forming a resist film 11. Then, as is shown in FIG. 2(b), the resist film 11 is irradiated with a $F_2$ laser beam 13 with a wavelength of a 157 nm band through a mask 12 for pattern exposure. In this manner, an acid is generated from the acid generator in an exposed portion 11a of the resist film 11 while no acid is generated in an unexposed portion 11b of the resist film 11.

Next, as is shown in FIG. 2(c), the semiconductor substrate 10 is heated. Although the base polymer is alkali-refractory, it decomposes when heated in the presence of an acid, and hence, the exposed portion 11a of the resist film 11 becomes soluble in an alkaline aqueous solution.

Thereafter, the resist film 11 is developed with an alkaline developer. Since the exposed portion 11a of the resist film 11 is dissolved in the developer, the unexposed portion 11b of the resist film 11 is formed into a resist pattern 14 as is shown in FIG. 2(d).

In the base polymer of Embodiment 9, an amino group is bonded to carbon constituting a double bond, and hence, the absorbing property against light of a short wavelength is decreased. Therefore, the absorbing property against light of a wavelength of a 1 nm through 180 nm band is decreased. Accordingly, the transmittance against the exposing light of a wavelength of a 1 nm through 180 nm band is increased, and hence, the exposing light can sufficiently reach the bottom of the resist film 11. As a result, the resist pattern can be formed in a good sectional shape with a line width of 0.1 μm.

Embodiment 10

In a base polymer of a resist material used in a pattern formation method of Embodiment 10, fluorine atoms are substituted for part of hydrogen atoms bonded to a benzene ring of poly(vinyl phenol). The specific composition of the resist material is described below. It is noted that a negative resist pattern is formed in Embodiment 10 while a positive resist pattern is formed in each of Embodiments 1 through 9.

| Base polymer: | |
|---|---|
| poly(o,o-difluoro-p-hydroxystyrene-co-o,o-difluoro-p-trifluoromethoxystyrene) | 1 g |
| Crosslinking agent: | |
| 2,4,6-tri(N,N-diethoxymethylamino)-1,3,5-triazine | 0.3 g |
| Acid generator: | |
| triphenylsulfonium triflate | 0.01 g |
| Solvent: | |
| ethyl lactate | 4 g |

Figure 3A:
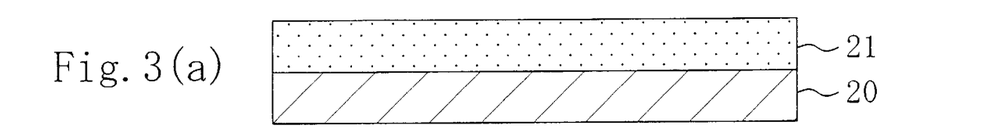
FIGS. 3(a) through 3(d) are sectional views for showing procedures in a pattern formation method according to Embodiment 10 of the invention.
Figure 3B:
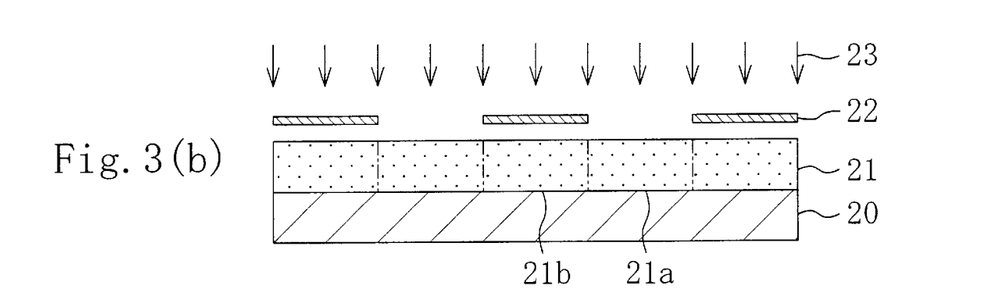

First, as is shown in FIG. 3(a), the resist material having the aforementioned composition is applied by spin coating on a semiconductor substrate 20, thereby forming a resist film 21. Then, as is shown in FIG. 3(b), the resist film 21 is irradiated with a $F_2$ laser beam 23 with a wavelength of a 157 nm band through a mask 22 for pattern exposure. In this manner, an acid is generated from the acid generator in an exposed portion 21a of the resist film 21 while no acid is generated in an unexposed portion 21b of the resist film 21.

Figure 3C:
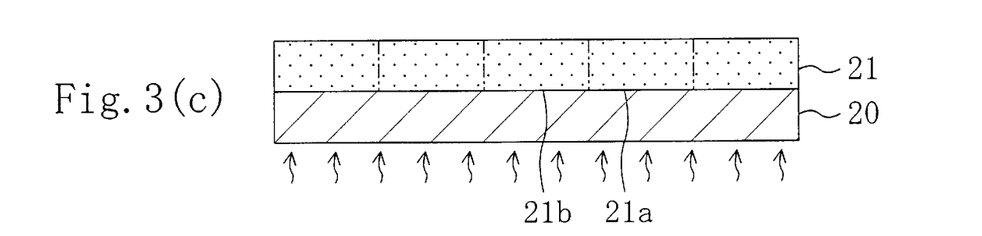

Next, as is shown in FIG. 3(c), the semiconductor substrate 20 is heated. Although the base polymer is alkali-soluble, crosslinkage is caused by the function of the crosslinking agent when it is heated in the presence of an acid, and hence, the exposed portion 21a of the resist film 21 becomes alkali-refractory.

Figure 3D:
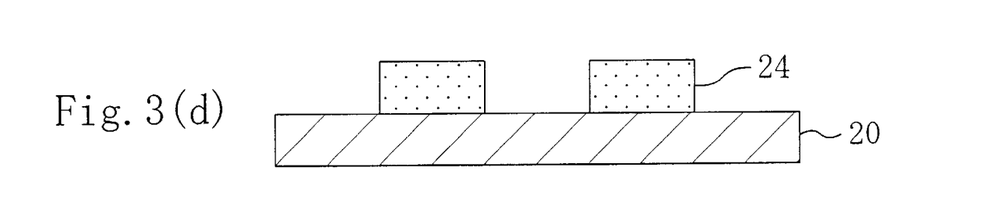

Thereafter, the resist film 21 is developed with an alkaline developer. Since the unexposed portion 21b of the resist film 21 is dissolved in the developer, the exposed portion 21a of the resist film 21 is formed into a resist pattern 24 as is shown in FIG. 3(d).

In the base polymer of Embodiment 10, fluorine atoms are substituted for part of hydrogen atoms bonded to the benzene ring of poly(vinyl phenol), and hence, the peak of the light absorption wavelength determined by the benzene ring is shifted toward a longer wavelength. Therefore, the absorbing property against light of a wavelength of a 1 nm through 180 nm band is decreased. Accordingly, the transmittance against the exposing light of a wavelength of a 1 nm through 180 nm band is increased, and hence, the exposing light can sufficiently reach the bottom of the resist film 21. As a result, the resist pattern can be formed in a good sectional shape with a line width of 0.1 μm.

Modification of Embodiment 10

Modification of Embodiment 10 is different from Embodiment 10 in the resist material alone, and hence, the resist material alone will be herein described. Specifically, the resist material includes a base polymer in which mercapto groups are substituted for part of hydrogen atoms bonded to a benzene ring of poly(vinyl phenol), and further includes a crosslinking agent including an alkoxy group.

| Base polymer: | |
|---|---|
| poly(p-hydroxystyrene-co-o-mercapto-p-methoxystyrene) | 1 g |
| Crosslinking agent: | |
| 1,3-dimethoxy-1,2,3-pentanetrioltriglycidyl ether | 0.3 g |
| Acid generator: | |
| triphenylsulfonium triflate | 0.01 g |
| Solvent: | |
| ethyl lactate | 4 g |

Embodiment 11

In a pattern formation method of Embodiment 11, a base polymer of a resist material includes a fluorine atom, and a water-soluble polymer film including a fluorine atom is deposited on a resist film. In Embodiment 11, a positive resist pattern is formed. The specific composition of the resist material is as follows:

| Base polymer: | |
|---|---|
| poly((2-methyl-2-adamantylmethacrylate) (30 mol %) - (tri(trifluoromethyl)methacrylate (30 mol %) - (methylmethacrylate) (30 mol %) - (methacrylic acid) (10 mol %) | 2 g |
| Acid generator: | |
| triphenylsulfonium triflate | 0.4 g |
| Solvent: | |
| diglyme | 20 g |

Figure 4A:
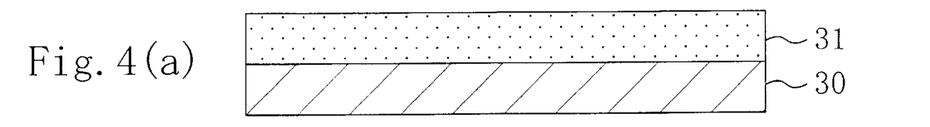
FIGS. 4(a) through 4(e) are sectional views for showing procedures in a pattern formation method according to Embodiment 11 or 12 of the invention.
Figure 4B:
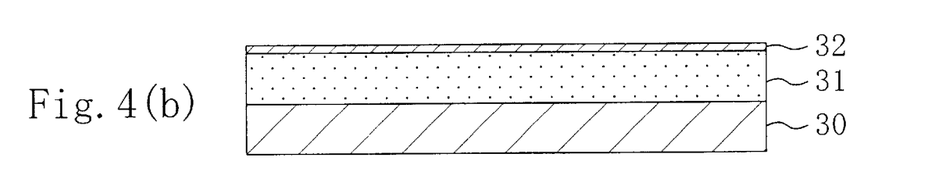

First, as is shown in FIG. 4(a), the resist material having the aforementioned composition is applied by spin coating on a semiconductor substrate 30, thereby forming a resist film 31 with a thickness of, for example, 0.5 μm. Then, as is shown in FIG. 4(b), a water-soluble polymer film 32 made from a water-soluble polymer including a fluorine atom is deposited on the resist film 31.

Examples of the water-soluble polymer are polyacrylic acid, poly(vinyl alcohol), poly(vinyl pyrrolidone) or polystyrene sulfonic acid in which halogen atoms such as a fluorine atom, cyano groups, nitro groups, alkoxy groups, amino groups, alkyl groups, trifluoromethyl groups or mercapto groups are substituted for all or part of hydrogen atoms; and polymers represented by Chemical Formulas 4 through 7 below, which do not limit the invention.

Figure 4C:
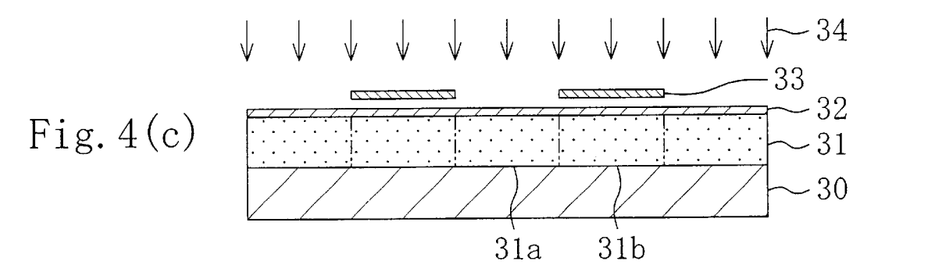

Chemical Formula 4:

Chemical Formula 5:

Chemical Formula 6:

Chemical Formula 7:

Next, as is shown in FIG. 4(c), the resist film 31 is irradiated with a $F_2$ laser beam 34 with a wavelength of a 157 nm band through a mask 33 for pattern exposure. In this manner, an acid is generated from the acid generator in an exposed portion 31a of the resist film 31 while no acid is generated in an unexposed portion 31b of the resist film 31.

Figure 4D:
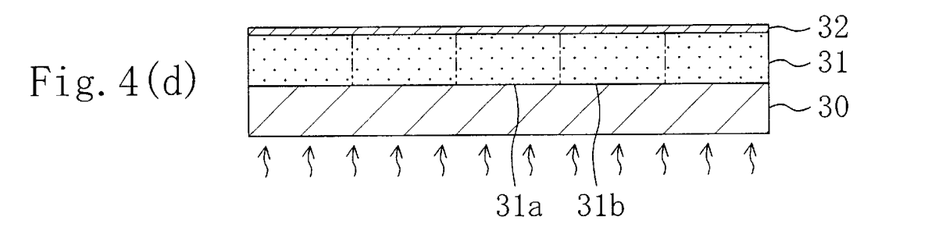

Then, as is shown in FIG. 4(d), the semiconductor substrate 30 is heated. Although the base polymer is alkali-refractory, it decomposes when heated in the presence of an acid, and hence, the exposed portion 31a of the resist film 31 becomes soluble in an alkaline aqueous solution.

Figure 4E:
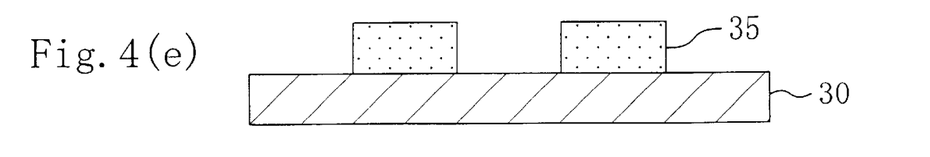

Thereafter, the water-soluble polymer film 32 is removed and the resist film 31 is developed with a 2.38 wt % tetramethylammonium hydroxide developer. Thus, the unexposed portion 31b of the resist film 31 is formed into a resist pattern 35 as is shown in FIG. 4(e).

In Embodiment 11, since both the base polymer of the resist material and the water-soluble polymer film 32 include a fluorine atom, the exposing light can definitely reach the bottom of the resist film 31. As a result, the resist pattern 35 can be formed in a good pattern shape.

Embodiment 12

In a pattern formation method of Embodiment 12, a base polymer of a resist material includes a fluorine atom, and a water-soluble polymer film made from a compound including a fluorine atom and a water-soluble polymer is deposited on a resist film. Also in Embodiment 12, a positive resist pattern is formed. The specific composition of the resist material is as follows:

| Base polymer: | |
|---|---|
| poly((2-methyl-2-adamantylmethacrylate) (30 mol %) - (tri(trifluoromethyl)methacrylate) (30 mol %) - (methylmethacrylate) (30 mol %) - (methacrylic acid) (10 mol %) | 2 g |
| Acid generator: | |
| triphenylsulfonium triflate | 0.4 g |
| Solvent: | |
| diglyme | 20 g |

First, as is shown in FIG. 4(a), the resist material having the aforementioned composition is applied by spin coating on a semiconductor substrate 30, thereby forming a resist film 31 with a thickness of, for example, 0.5 μm. Then, as is shown in FIG. 4(b), a water-soluble polymer film 32 made from a compound including a fluorine atom and a water-soluble polymer is deposited on the resist film 31.

Examples of the compound including a fluorine atom are trifluoroacetic acid, trifluoromethylsulfonic acid and a surfactant including fluorine, which do not limit the invention.

Also, examples of the water-soluble polymer are polyacrylic acid, poly(vinyl alcohol), poly(vinyl pyrrolidone) and polystyrenesulfonic acid, which do not limit the invention.

Next, as is shown in FIG. 4(c), the resist film 31 is irradiated with a $F_2$ laser beam 34 with a wavelength of a 157 nm band through a mask 33 for pattern exposure. In this manner, an acid is generated from the acid generator in an exposed portion 31a of the resist film 31 while no acid is generated in an unexposed portion 31b of the resist film 31.

In this case, since the water-soluble polymer film 32 includes a fluorine atom, the water-soluble polymer film 32 guides merely light with high intensity to the resist film 31.

Then, as is shown in FIG. 4(d), the semiconductor substrate 30 is heated. Although the base polymer is alkali-refractory, it decomposes when heated in the presence of an acid, and hence, the exposed portion 31a of the resist film 31 becomes soluble in an alkaline aqueous solution.

Thereafter, the water-soluble polymer film 32 is removed and the resist film 31 is developed with a 2.38 wt % tetramethylammonium hydroxide developer. Thus, the unexposed portion 31b of the resist film 31 is formed into a resist pattern 35 as is shown in FIG. 4(e).

In Embodiment 12, since both the base polymer of the resist material and the water-soluble polymer film 32 include a fluorine atom, the exposing light can definitely reach the bottom of the resist film 31. As a result, the resist pattern 35 can be formed in a good pattern shape.

Embodiment 13

In a base polymer of a resist material used in a pattern formation method of Embodiment 13, fluorine atoms are substituted for part of hydrogen atoms bonded to a benzene ring of poly(vinyl phenol). It is noted that a novolak resin, that is, a general resist material, is used for forming a negative resist pattern in Embodiment 13 while a chemically amplified resist is used in each of Embodiments 1 through 12. The specific composition of the resist material is as follows:

| Base polymer: | |
|---|---|
| poly(o,o-difluoro-p-hydroxy-α-fluorostyrene-co-o,o-difluoro-p-trifluoromethoxy-α-fluorostyrene) | 1 g |
| Solvent: | |
| propylene glycol monoethyl ether acetate | 4 g |

Figure 5A:
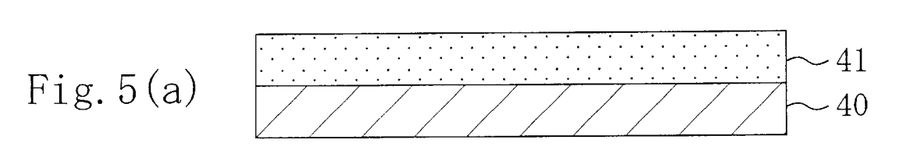
FIGS. 5(a) through 5(c) are sectional views for showing procedures in a pattern formation method according to Embodiment 13 of the invention.
Figure 5B:
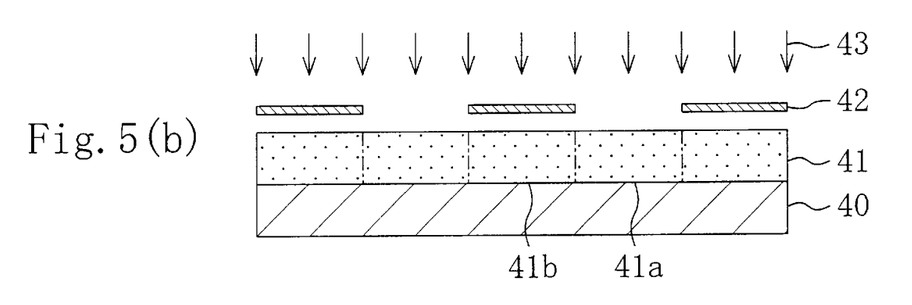

First, as is shown in FIG. 5(a), the resist material having the aforementioned composition is applied by spin coating on a semiconductor substrate 40, thereby forming a resist film 41. Then, as is shown in FIG. 5(b), the resist film 41 is irradiated with a $F_2$ laser beam 43 with a wavelength of a 157 nm band through a mask 42 for pattern exposure. As a result, although the resist material is alkali-soluble, an exposed portion 41a of the resist film 41 becomes refractory in an alkaline aqueous solution through a crosslinking reaction while an unexposed portion 41b of the resist film 41 remains alkali-soluble.

Figure 5C:
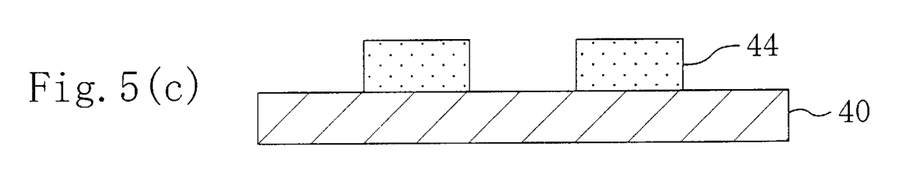

Next, the resist film 41 is developed with an alkaline developer. Since the unexposed portion 41b of the resist film 41 is dissolved in the developer, the exposed portion 41a of the resist film 41 is formed into a resist pattern 44 as is shown in FIG. 5(c).

In the base polymer of Embodiment 13, fluorine atoms are substituted for part of hydrogen atoms bonded to a benzene ring, and hence, the light absorption wavelength determined by the benzene ring is shifted toward a longer wavelength. Therefore, the absorbing property against light of a wavelength of a 1 nm through 180 nm band is decreased. Accordingly, the transmittance against the exposing light of a wavelength of a 1 nm through 180 nm band is increased, and hence, the exposing light can sufficiently reach the bottom of the resist film 41. As a result, the resist pattern can be formed in a good sectional shape with a line width of 0.12 μm.

Although the $F_2$ laser beam with a wavelength of a 157 nm band is used as the exposing light in each of Embodiments 1 through 13 and Modifications thereof, the same effect can be attained by using a $Xe_2$ laser beam (with a wavelength of a 172 nm band), a $Kr_2$ laser beam (with a wavelength of a 146 nm band), an ArKr laser beam (with a wavelength of a 134 nm band), an $Ar_2$ laser beam (with a wavelength of a 126 nm band) or a soft X-ray beam (with a wavelength of a 13, 11 or 5 nm band) instead.

Furthermore, in each of Embodiments 1 through 12 and Modifications thereof, any of onium salts such as a sulfonium salt and a iodonium salt, sulfonic esters, diazodisulfonylmethanes and ketosulfone compounds can be appropriately used as the acid generator.

Moreover, in each of Embodiments 1 through 12 and Modifications thereof, the resist material can include a basic compound such as amine or an additive such as a surfactant, if necessary.

What is claimed is:

1. A pattern formation method comprising the steps of:
   forming a resist film by applying, on a substrate, a chemical amplified resist material comprising a base polymer wherein said base polymer a fluoroalkyl group in a side chain of said base polymer;
   irradiating said resist film for pattern exposure with $Xe_2$ laser beam, $F_2$ laser beam, $Kr_2$ laser beam, ArKr laser beam or $Ar_2$ laser beam; and
   forming a resist pattern by developing the pattern-exposed resist film.

2. The pattern formation method of claim 1, wherein said fluoroalkyl group is comprised in a protecting group eliminated by an acid and constitutes said base polymer.

3. The pattern formation method of claim 1, wherein said fluoroalkyl group is a trifluoromethyl group.

4. The pattern formation method of claim 1, wherein said base polymer is a poly(vinyl phenyl) or a polymer comprising an acrylic acid.

5. The pattern formation method of claim 1, wherein said base polymer is a polymer selected from the group consisting of a poly((2-methyl-adamantylmethacrylate)-(tri (trifluoromethyl)methacrylate) (methylacrylate)-(methacrylic acid)), a poly(2,2,2-trifluoroethylmethacrylate), a poly(1,1,1,3,3,3-hexafluoroisopropyl methacrylate), a poly((2,2,2-trifluoroethylmethacrylate)-(2-methyl-2-adamantylmethacrylate)) and a poly(o,o-difluoro-p-hydroxystyrene-co-o,o-difluoro-p-thifluoromethoxystyrene).

6. The pattern formation method of claim 1, wherein said resist includes a dissolution inhibiting agent.

7. The pattern formation method of claim 6, wherein said dissolution inhibiting agent is a bis(p-(t-butoxycarbonyloxy)-m,m-difluorophenyl)methane.

8. The pattern formation method of claim 1, wherein said resist includes a cross-linking agent.

9. The pattern formation method of claim 8, wherein said cross-linking agent is a 2,4,6-tri(N,N-diethoxymethylamino)-1,3,5-triazine.

10. The pattern formation method of claim 1, wherein said base polymer includes a water-soluble polymer.

11. The pattern formation method of claim 10, wherein said water-soluble polymer is represented by chemical formula 6 or chemical formula 7

12. The pattern formation method of claim 10, wherein said water-soluble polymer is a poly((2-methyl-2-adamantylmethacrylate)-(tri(trifluoromethyl)methacrylate)-(methylmethacrylate)-(methacrylic acid)).

13. A pattern formation method comprising the steps of:
   forming a resist film by applying, on a substrate, a chemical amplified resist material comprising a base polymer, wherein said base polymer includes a triflouromethyl group on a main chain of said polymer;
   irradiating said resist film for pattern exposure with a $Xe_2$ laser beam, $F_2$ laser beam, $Kr_2$ laser beam, ArKr laser beam or an $Ar_2$ laser beam; and
   forming a resist pattern by developing the pattern-exposed resist film.

14. The pattern formation method of claim 13, wherein said base polymer is a poly(vinyl phenol) or a polymer comprising an acrylic acid.

15. The pattern formation method of claim 13, wherein said base polymer is a poly(p-α-trifluoromethylvinyl) phenol-co-p-(1-ethoxyethoxy-α-trifluoromethylstyrene.

* * * * *